United States Patent
Dorfner et al.

(10) Patent No.: US 12,463,048 B2
(45) Date of Patent: Nov. 4, 2025

(54) METHODS FOR FORMING SEMICONDUCTOR DEVICES USING METAL HARD MASKS

(71) Applicant: Tokyo Electron Limited, Tokyo (JP)

(72) Inventors: Alec Dorfner, Albany, NY (US); Minjoon Park, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 562 days.

(21) Appl. No.: 17/901,727

(22) Filed: Sep. 1, 2022

(65) Prior Publication Data

US 2024/0079246 A1   Mar. 7, 2024

(51) Int. Cl.
*H01L 21/308* (2006.01)

(52) U.S. Cl.
CPC ...... *H01L 21/3086* (2013.01); *H01L 21/3081* (2013.01)

(58) Field of Classification Search
CPC ............ H01L 21/3086; H01L 21/3081; H01L 21/0332; H01L 21/0337
See application file for complete search history.

(56) References Cited

U.S. PATENT DOCUMENTS

| | | | |
|---|---|---|---|
| 5,843,847 A | 12/1998 | Pu et al. | |
| 6,933,192 B1 | 8/2005 | Divakaruni et al. | |
| 6,969,685 B1 | 11/2005 | Li et al. | |
| 7,419,913 B2 | 9/2008 | Graettinger et al. | |
| 9,105,697 B2 | 8/2015 | Chiu | |
| 9,559,188 B2 | 1/2017 | Nakamura et al. | |
| 10,431,458 B2 | 10/2019 | Hudson et al. | |
| 10,903,109 B2 | 1/2021 | Tokashiki et al. | |
| 2005/0142734 A1 | 6/2005 | Shin | |
| 2007/0034927 A1 | 2/2007 | Seidl et al. | |
| 2017/0076945 A1* | 3/2017 | Hudson | H01J 37/3244 |
| 2020/0251344 A1* | 8/2020 | Hisamatsu | H01L 21/0273 |
| 2021/0028187 A1* | 1/2021 | Byeon | H01L 21/0217 |

FOREIGN PATENT DOCUMENTS

KR   20210082359 A   7/2021

OTHER PUBLICATIONS

International Search Report and Written Opinion on PCT App. PCT/US2023/029189 dated Nov. 21, 2023 (10 pages).

* cited by examiner

*Primary Examiner* — Walter H Swanson
(74) *Attorney, Agent, or Firm* — Foley & Lardner LLP (57) ABSTRACT

A method for forming a semiconductor device is disclosed. The method includes forming a first metal layer on top of an amorphous mask layer disposed over a substrate. The method includes forming a second metal layer that extends along vertical sidewalls of an opening in the amorphous mask layer. The method includes forming a first recess partially extending into the substrate using the first metal layer and the second metal layer as a first etch mask. The method includes forming a third metal layer that extends along vertical sidewalls of the first recess. The method includes forming a second recess below the first recess using the first to third metal layers as a second etch mask.

20 Claims, 13 Drawing Sheets

METHODS FOR FORMING SEMICONDUCTOR DEVICES USING METAL HARD MASKS

FIELD OF THE DISCLOSURE

This disclosure relates generally to hard masks for semiconductor processing and in particular to metal hard masks for manufacturing high aspect ratio geometries.

BACKGROUND

Semiconductor circuits continue to scale to smaller areas. To increase the number of transistors and other semiconductor devices per unit area, manufacturers are now utilizing another dimension, e.g., a vertical third dimension (3D). For example, in a 3D NAND memory array, charge trapping flash transistors are stacked vertically one on top of another on the sidewalls in high aspect ratio openings. In DRAM memory arrays, to increase capacitance, high aspect ratio DRAM trench capacitor openings are etched deeper and deeper into the semiconductor substrate. Through silicon vias (TSV) for stacking integrated circuit chips are fabricated by etching high aspect ratio holes completely through substrates.

Etch masks used to etch high aspect ratio openings such as trenches and holes need high mask-to-substrate etch selectivity to maintain pattern integrity throughout the extended high aspect ratio opening etches. Because etch selectivity of photoresist may be inadequate, photoresist patterns are etched into hard masks and hard mask patterns are used as etch masks when etching high aspect ratio features.

SUMMARY

At least one aspect of the present disclosure is directed to a method for forming a semiconductor device. The method includes forming a first metal layer on top of an amorphous mask layer disposed over a substrate. The method includes forming a second metal layer that extends along vertical sidewalls of an opening in the amorphous mask layer. The method includes forming a first recess partially extending into the substrate using the first metal layer and the second metal layer as a first etch mask. The method includes forming a third metal layer that extends along vertical sidewalls of the first recess. The method includes forming a second recess below the first recess using the first to third metal layers as a second etch mask.

The first to third metal layers may each comprise a refractory metal.

The second and third metal layers may each comprise a metal material selected from the group consisting of: tungsten, titanium, tantalum, molybdenum, chromium, hafnium, ruthenium, and combinations thereof. In one implementation, the second and third metal layers each comprise titanium and tungsten.

The first to third metal layers may each comprise tungsten or tungsten nitride.

The first to third metal layer are, in some implementations, comprised of the same metal material.

The amorphous mask layer may comprise amorphous carbon or amorphous silicon.

According to the technique, the first recess has a first aspect ratio of its depth to its width, and the second recess has a second aspect ratio of its depth to its width, and wherein the second aspect ratio is substantially greater than the first aspect ratio.

The substrate may be comprised of a single dielectric layer having silicon oxide.

Additionally or alternatively, the substrate is comprised of a plurality of alternately stacked first dielectric layers and second dielectric layers, the first dielectric layers each having silicon dioxide and the second dielectric layers each having silicon nitride or silicon oxynitride.

The method further includes filling the first and second recesses with a semiconductor material or a metal material.

At least another aspect of the present disclosure is directed to a method for forming a semiconductor device. The method includes forming a low stress mask layer over a substrate. The method includes forming a first metal layer comprising a first metal over the low stress mask layer. The method includes forming an opening in the first metal layer and the low stress mask layer. The method includes forming a first portion of a metal spacer comprising a second metal along sidewalls of the opening. The method includes etching the substrate to form a first recess using the first metal layer and the first portion of the metal spacer as a first etch mask. The method includes forming a second portion of the metal spacer comprising a third metal along sidewalls of the first recess. The method includes again etching the substrate to form a second recess below the first recess using the first metal layer and both of the first and second portions of the metal spacer as a second etch mask.

The method further includes depositing a second metal layer; and etching horizontally extending portions of the second metal layer to form the first portion of the metal spacer.

The method further includes depositing a third metal layer; and etching horizontally extending portions of the third metal layer to form the second portion of the metal spacer.

In some implementations, the first to third metals each comprise a refractory metal.

The method further includes filling the first and second recesses with a semiconductor material or a metal material. The method further includes forming a feature of a three-dimensional (3D) memory cell based on the semiconductor material or the metal material filling the first and second recesses.

The first recess has a first aspect ratio of its depth to its width, and the second recess has a second aspect ratio of its depth to its width, and wherein the second aspect ratio is substantially greater than the first aspect ratio.

Yet another aspect of the present disclosure is directed to an apparatus for forming a semiconductor device. The apparatus includes a first chamber configured to house a substrate overlaid by a mask layer and perform deposition of a first metal layer over the mask layer; a second chamber configured to form an opening through the first metal layer and the mask layer; a third chamber configured to perform deposition of a second metal layer to extend along vertical sidewalls of the opening; a fourth chamber configured to etch a horizontal portion of the second metal layer; a fifth chamber configured to form, based at least on a remaining vertical portion of the second metal layer, a first recess extending into the substrate; a sixth chamber configured to perform deposition of a third metal layer to extend along vertical sidewalls of the first recess; a seventh chamber configured to etch a horizontal portion of the third metal layer; and an eighth chamber configured to form, based at least on a remaining vertical portion of the third metal layer, a second recess further extending into the substrate.

The first chamber, the third chamber, and the sixth chamber may be the same chamber.

These and other aspects and implementations are discussed in detail below. The foregoing information and the following detailed description include illustrative examples of various aspects and implementations and provide an overview or framework for understanding the nature and character of the claimed aspects and implementations. The drawings provide illustrations and a further understanding of the various aspects and implementations and are incorporated in and constitute a part of this specification. Aspects can be combined, and it will be readily appreciated that features described in the context of one aspect of the invention can be combined with other aspects. Aspects can be implemented in any convenient form. As used in the specification and in the claims, the singular form of "a," "an," and "the" include plural referents unless the context clearly dictates otherwise.

BRIEF DESCRIPTION OF THE DRAWINGS

Non-limiting embodiments of the present disclosure are described by way of example with reference to the accompanying figures, which are schematic and are not intended to be drawn to scale. Unless indicated as representing the background art, the figures represent aspects of the disclosure. For purposes of clarity, not every component may be labeled in every drawing. In the drawings.

DETAILED DESCRIPTION

Reference will now be made to the illustrative embodiments depicted in the drawings, and specific language will be used here to describe the same. It will nevertheless be understood that no limitation of the scope of the claims or this disclosure is thereby intended. Alterations and further modifications of the inventive features illustrated herein, and additional applications of the principles of the subject matter illustrated herein, which would occur to one skilled in the relevant art and having possession of this disclosure, are to be considered within the scope of the subject matter disclosed herein. Other embodiments may be used and/or other changes may be made without departing from the spirit or scope of the present disclosure. The illustrative embodiments described in the detailed description are not meant to be limiting of the subject matter presented.

Hard masks utilized to etch high aspect ratio trenches and holes may be formed relatively thick to permit only vertically directed atoms and ions from the etching gases to impinge upon the surface of a substrate. While hard masks made of a metal such as tungsten (W), titanium-tungsten (TiW), or titanium nitride (TiN) may provide the required selectivity, stress from thick metal layers may be excessive. Hard masks fabricated from thick low stress materials, such as amorphous carbon and amorphous silicon, may provide acceptable stress, but selectivity is low when etching deep high aspect ratio trenches and holes. Because of the lower selectivity, very thick layers of amorphous materials have to be deposited, which may still not be sufficient to protect the underlying materials.

Gas mixtures such as Ar and $O_2$ along with fluorinated hydrocarbons such as CIF's, $C_4F_6$, and $C_3F_8$ are generally used to etch high aspect ratio features in a dielectric such as silicon dioxide. Fluorinated hydrocarbons such as $CHF_3$, $CH_3F$, and $CH_2F_2$ are generally used to etch high aspect ratio features into dielectrics such as silicon nitride (SiN). Features such as openings having depth to width ratios greater than 20 are generally considered to be high aspect ratio features. Because the hard mask to substrate selectivity is low, higher carbon containing fluorocarbons may be added to the etching chemistry to improve selectivity between the mask material, e.g., amorphous hard mask and material being etched. A higher carbon content fluorocarbon gas increases hard mask selectivity by increasing polymer deposition on the surface of the amorphous hard mask. Unfortunately, during etching of high aspect ratio features, polymer can also deposit on the sidewalls of these high aspect ratio features causing tapering on the sidewalls, which results in the bottom of the features being reduced in size and distorted. For example, the bottom critical dimension (CD) of the opening formed may be much smaller than the top CD of the opening.

The present disclosure provides various embodiments of a method for forming (e.g., etching) high aspect ratio geometries using a metal shell hard mask. In various embodiments, the metal shell hard mask dose not induce significant stress and can provide high hard mask to substrate selectivity using low polymer forming fluorocarbon gases. The metal shell hard mask, as disclosed herein, is first formed by covering the surfaces of a low stress mask material with a first thin metal shell. Based on the first thin metal shell (which forms a first portion of a metal spacer), a first recess can be formed in an underlying dielectric layer. The disclosed metal shell hard mask can then be formed by forming a second portion of the metal spacer. Collectively using the first and second portions of the metal spacer, a second recess with a high aspect ratio (of its depth to width) can be formed in the dielectric layer below the first recess.

Figure 1:
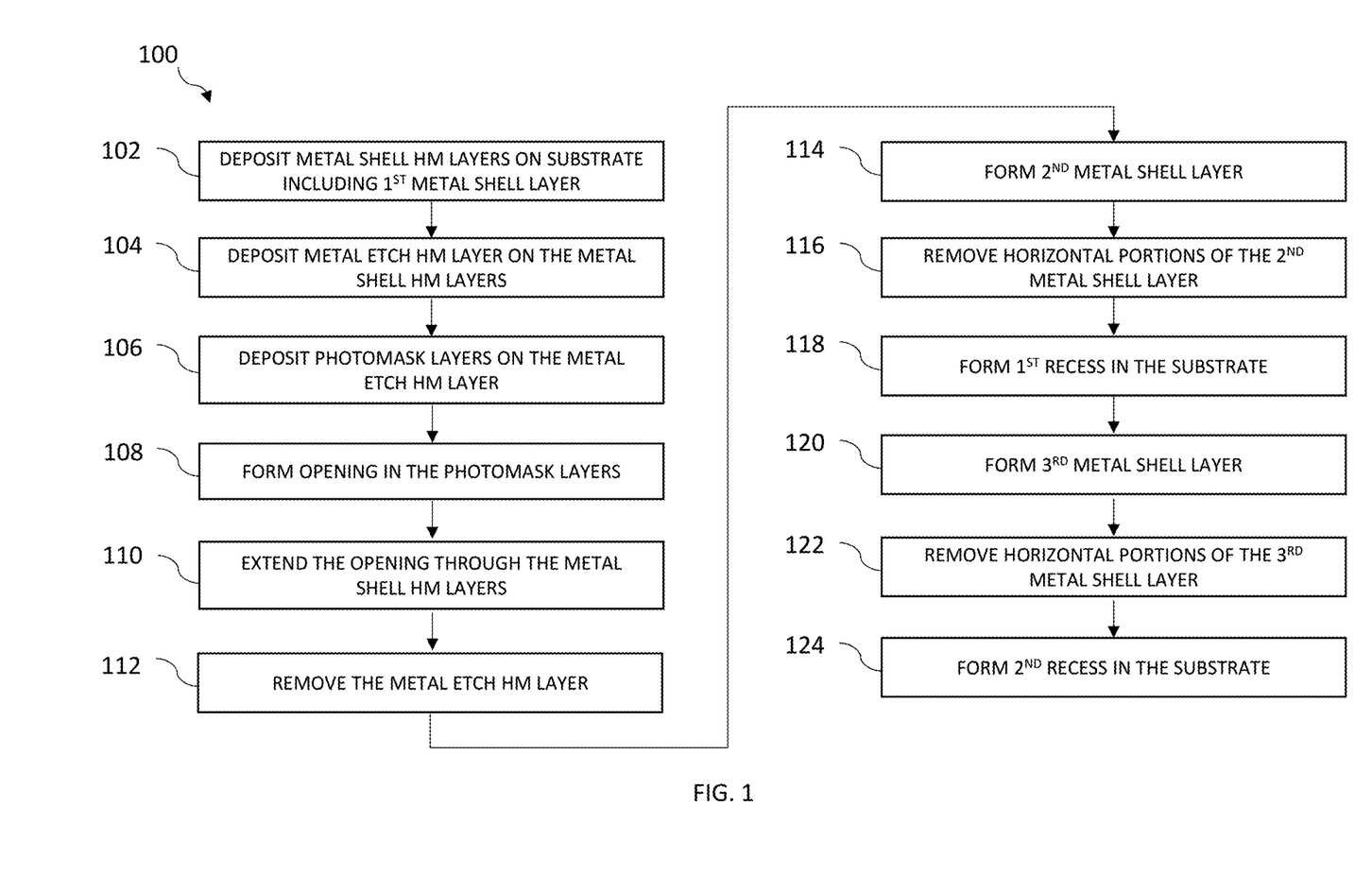
FIG. 1 illustrates a flow chart of a method for forming a semiconductor device using a metal shell hard mask, in accordance with various embodiments.

FIG. 1 illustrates a flow chart of an example method 100 for the formation of a metal shell hard mask and fabrication of a semiconductor device, in accordance with various embodiments. FIGS. 2-13 are cross-sectional views of such a semiconductor device 200 describing some of the major operations described in the method 100 of FIG. 1. For example, a feature (e.g., an opening) with a high aspect ratio is formed (e.g., etched) into one or more dielectric layers disposed on a semiconductor substrate. Such a high aspect ratio opening can be in rectangular, square, circular (as in contacts) or any other regular or irregular shape. The high aspect ratio opening can be a trenches or a hole, in various embodiments.

Figure 2:
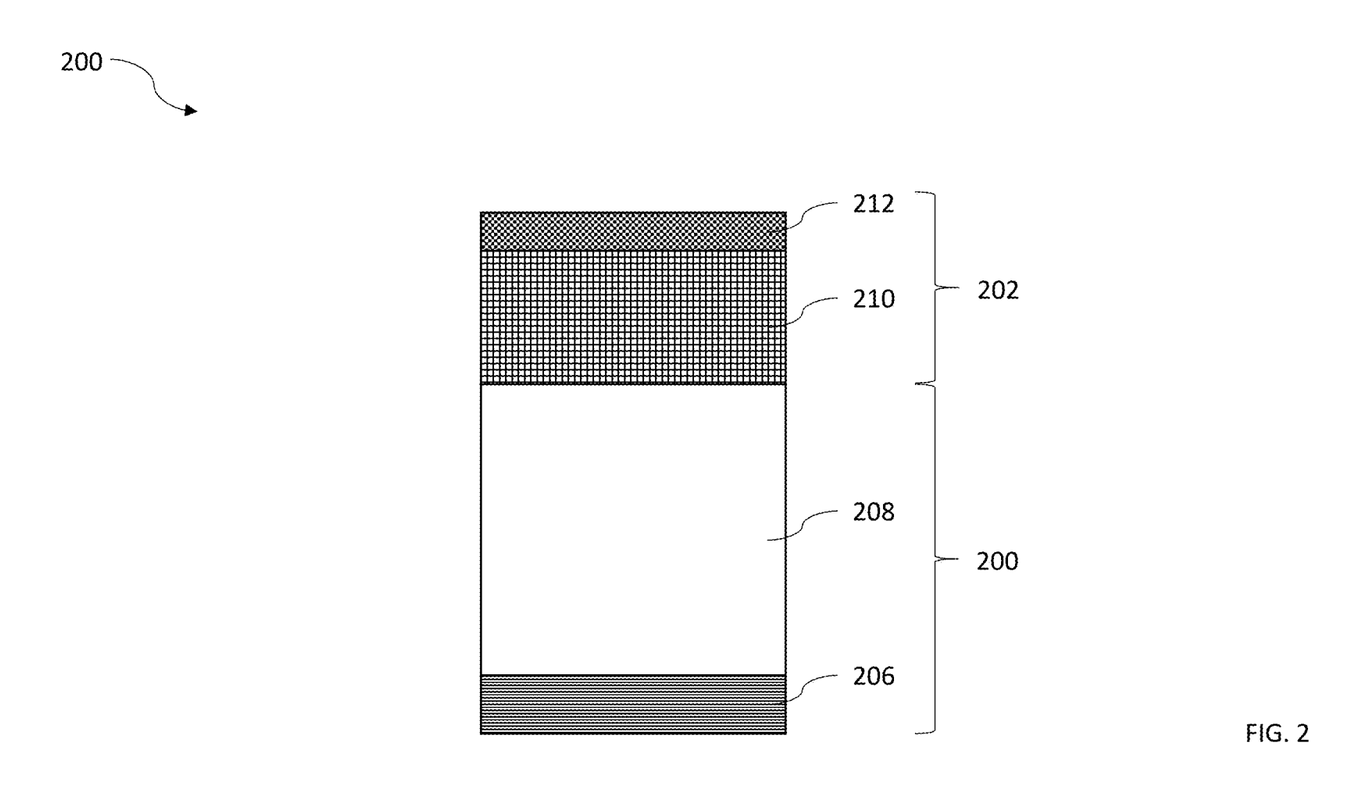
FIGS. 2-13 illustrate cross-sectional views of a semiconductor device, made by the method shown in FIG. 1, during various stages of fabrication, in accordance with various embodiments.

Referring to operation 102 in FIG. 1 and to the cross-sectional view in FIG. 2, a number of metal shell hard mask layers 202 are deposited on a substrate 200. The substrate 200 may comprise a semiconductor substrate 206 with an overlying dielectric layer 208. Although the dielectric layer 208 is shown as a single layer, it should be understood that the dielectric layer 208 can include a plural number of layers stacked on top of one another.

In various embodiments, the semiconductor substrate 206 may be a single crystal semiconductor substrate such as a single crystal silicon wafer or a silicon-on-insulator substrate. As mentioned above, in some embodiments, the dielectric layer 208 may be a single dielectric layer having silicon oxide. In some other embodiments, the dielectric layer 208 may include a plurality of alternately stacked first dielectric layers and second dielectric layers, where the first dielectric layers each have silicon dioxide and the second dielectric layers each have silicon nitride or silicon oxynitride. With such embodiments, the nitride-based second dielectric layers may later be replaced with metal layers, while the oxide-based first dielectric layers may serve as isolation layers between those metal layers.

In various embodiments, the metal shell hard mask layers 202 comprise a layer of amorphous mask layer 210, such as amorphous carbon or amorphous silicon, covered with a thin first metal shell layer 212. The amorphous mask layer 210 may be deposited using spin-on processes and may comprise spin-on carbon, for example. The amorphous mask layer 210 may in various embodiment be formed as a low stress mask material that have relatively low intrinsic stress due to the relaxation of the amorphous material. For example, the intrinsic stress of the low stress mask material, as measured, e.g., with wafer bow experiments, may be less than +/−20 MPa, and preferably close to zero. The first metal shell layer 212 may comprise a refractory metal such as tungsten, molybdenum, niobium, tantalum, titanium, chromium, hafnium, ruthenium, and zirconium including oxides, nitrides, oxynitrides of refractory metals. In one embodiment, the first metal shell layer 212 may comprise tungsten (W), tungsten nitride (WN), titanium tungsten (TiW), titanium (Ti), titanium nitride (TiN), tantalum (Ta), tantalum nitride (TaN), molybdenum as well as carbides such as tungsten carbide. In various embodiments, the first metal shell layer 212 may be deposited using various thin film deposition techniques such as physical vapor deposition, chemical vapor deposition, atomic layer deposition, as well as other techniques such as sputtering, evaporation and others.

A thickness of the amorphous mask layer 210 is generally determined based on a depth of the high aspect ratio opening, e.g., trench or hole, to be etched into dielectric layer 208. A thickness of the first metal shell layer 212 can range from about 2 nanometers (nm) to 500 nm or more. Generally, the thickness of the first metal shell layer 212 may depend on the stress of the amorphous mask layer 210 and the dimensions of the opening being formed.

Figure 3:
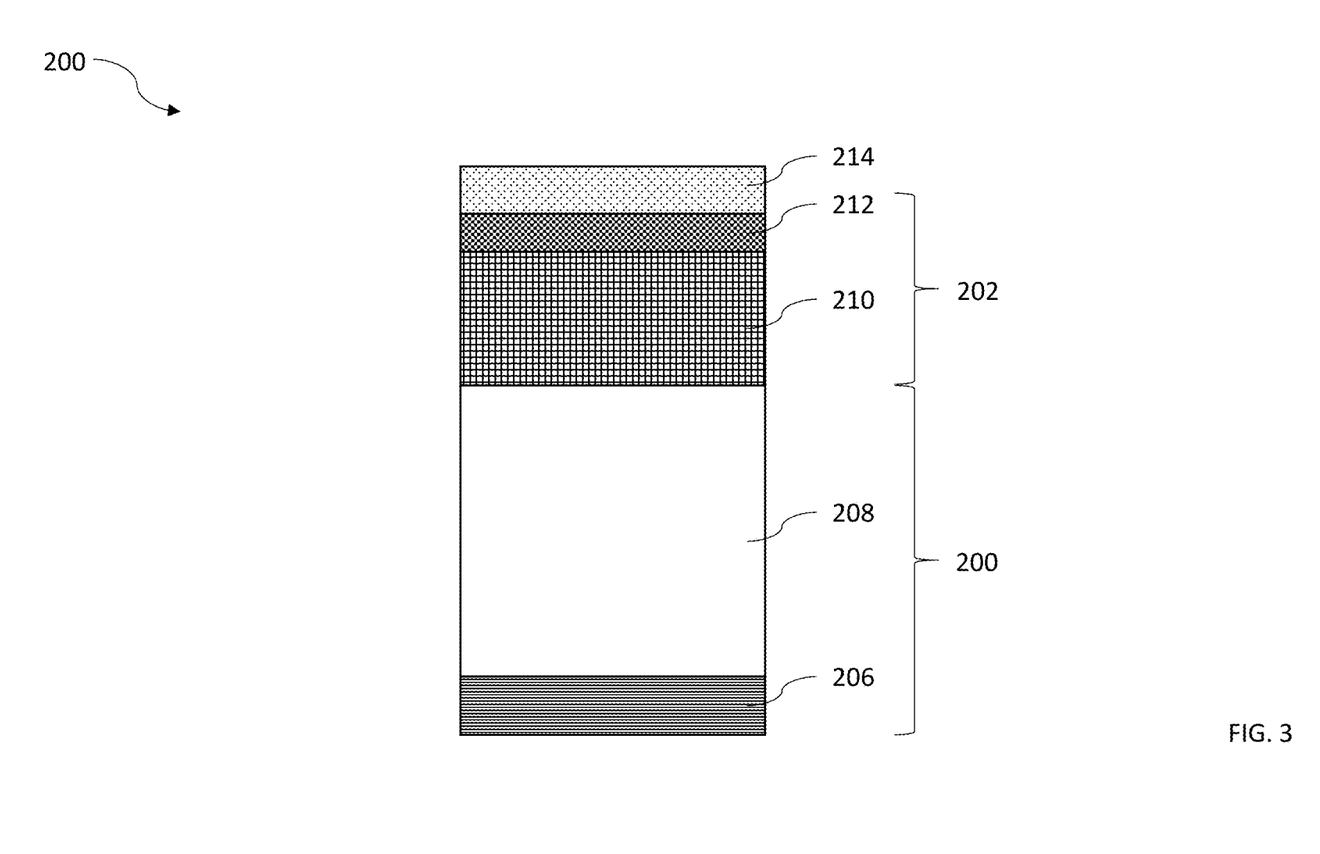

In operation 104 of FIG. 1 and the cross-sectional view in FIG. 3, a metal etch hard mask layer 214 is deposited on the first metal shell layer 212. The metal etch hard mask layer 214 is the hard mask layer primarily used as the etch mask while etching the first metal shell layer 212. The metal etch hard mask layer 214 can be a dielectric layer such as $SiO_2$, SiON, or SiN and deposited with known deposition techniques including vapor deposition techniques such as physical vapor deposition, chemical vapor deposition, plasma enhanced vapor deposition, and atomic layer deposition.

Figure 4:
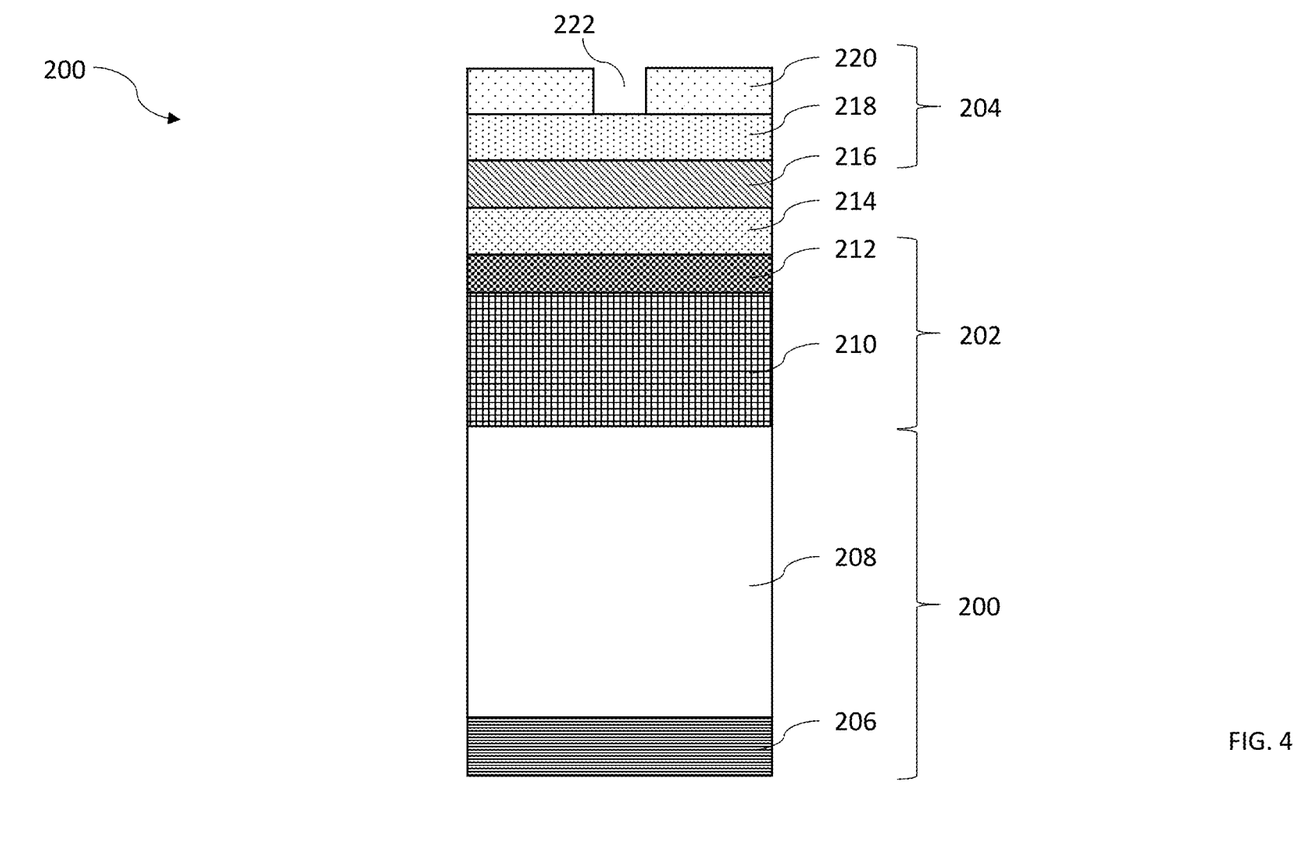

Referring next to operation 106 of FIG. 1 and the cross-sectional view in FIG. 4, photomask layers 204 are deposited on the metal etch hard mask layer 214. The photomask layers 204 can be a trilayer photomask (as shown in the example of FIG. 4) having a bottom organic (ODL) layer 216, a middle antireflective coat layer 218, and a top photoresist layer 220. However, it should be understood that the photomask layers 204 can include any suitable single layer or any number of stacked layers, while remaining within the scope of the present disclosure. Upon forming a topmost one of the photomask layers 204 (e.g., the photoresist layer 220), an opening 222 is formed in the photoresist layer 220 using suitable photolithography techniques.

Figure 5:
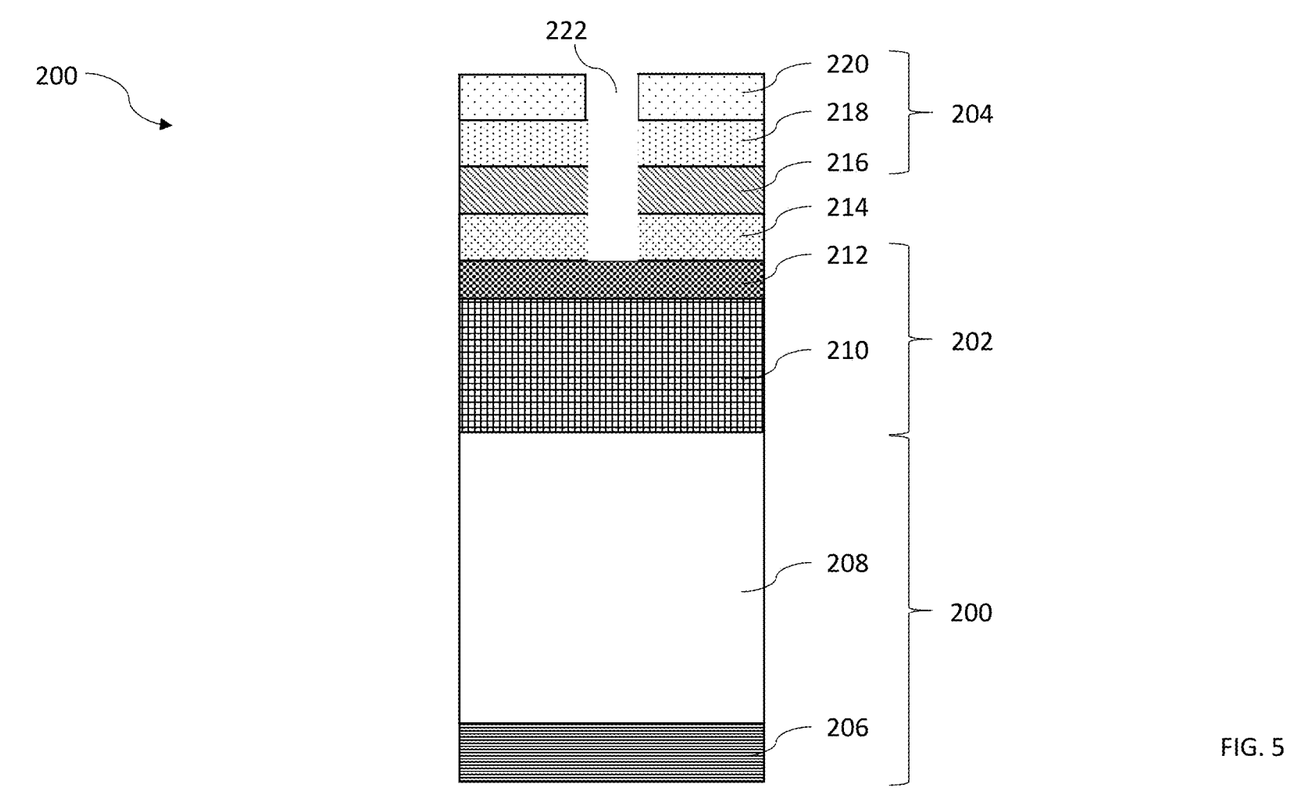

Referring next to operation 108 of FIG. 1 and the cross-sectional view in FIG. 5, the opening 222 is etched through the antireflective coat layer 218, through the bottom organic layer 216, and through the metal etch hard mask layer 214. In some embodiments, the opening 222 may stop on the first metal shell layer 212. The opening 222 may be etched using any suitable anisotropic etching processes such as reactive ion etching.

Figure 6:
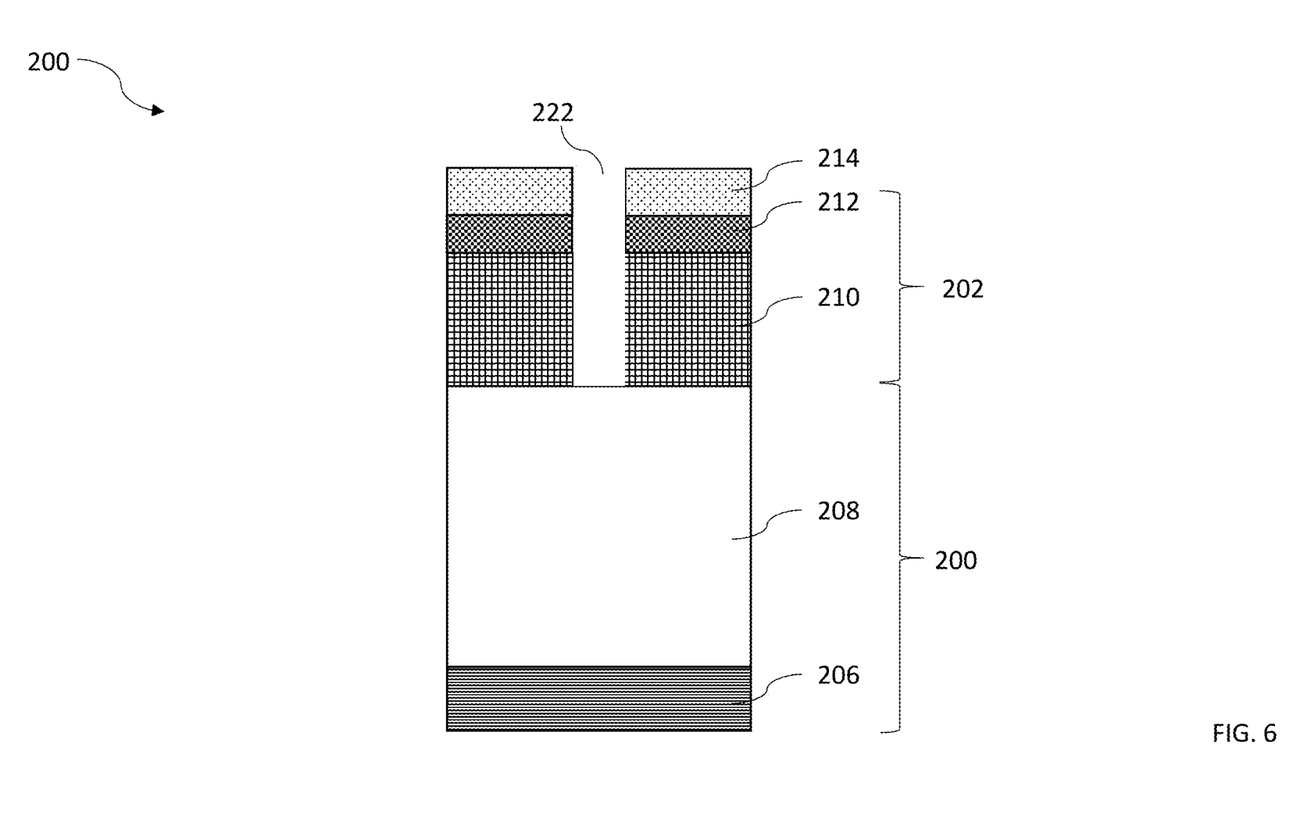

Referring next to operation 110 of FIG. 1 and the cross-sectional view in FIG. 6, after transferring the pattern to the metal etch hard mask layer 214 (e.g., by extending the opening 222 in operation 108), the photomask layers 204 may be removed from the metal etch hard mask layer 214. Next, an anisotropic etch process using the metal etch hard mask layer 214 as etch mask, can further extend the opening 222 through the metal shell hard mask layers 202 comprising the first metal shell layer 212 and the amorphous mask layer 210, as shown in FIG. 6. The opening 222 may stop on the dielectric layer 208, in some embodiments.

Figure 7:
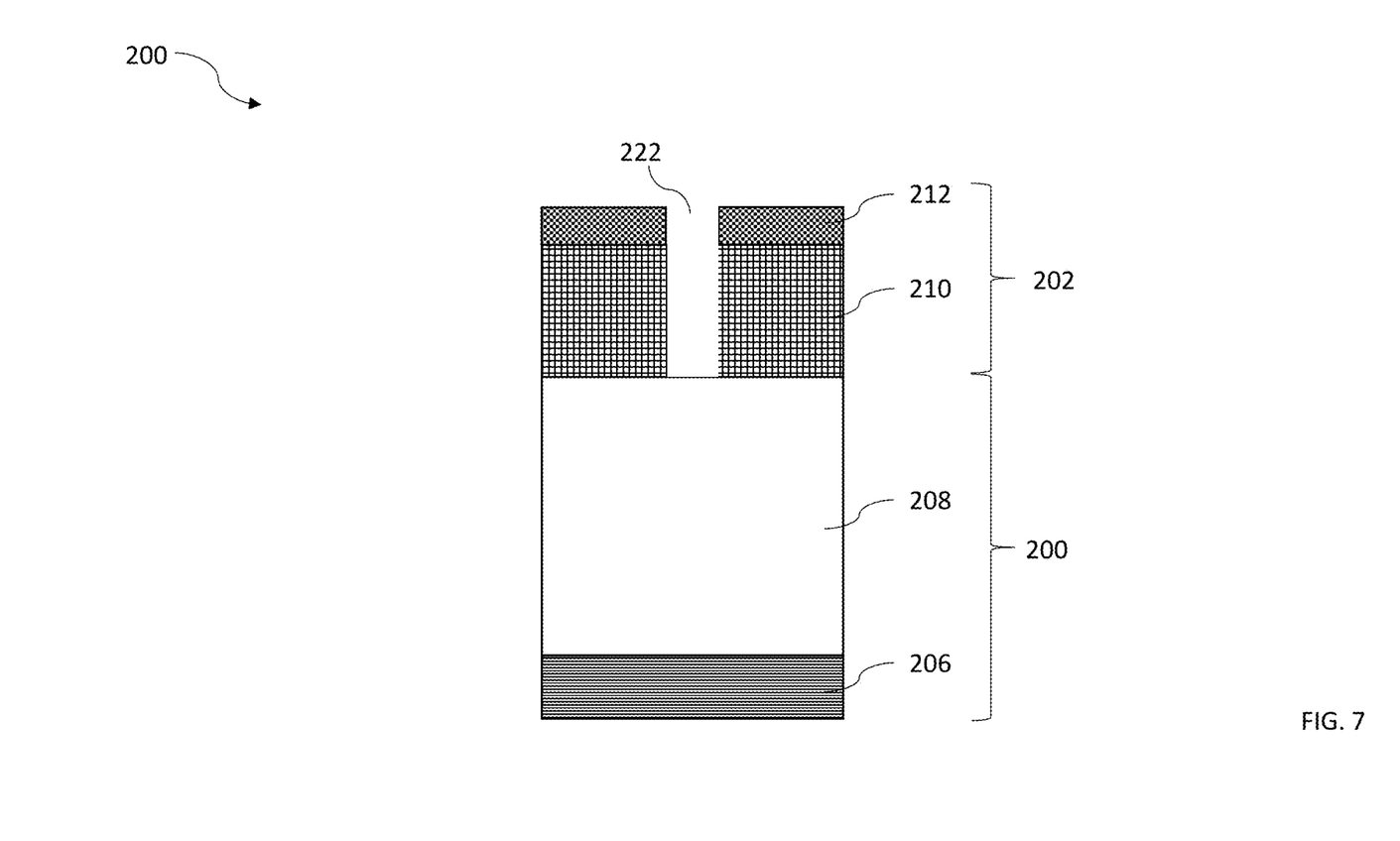

Referring next to operation 112 of FIG. 1 and the cross-sectional view in FIG. 7, upon transferring the pattern to the metal shell hard mask layers 202 (e.g., by extending the opening 222 in operation 110), the metal etch hard mask layer 214 can be removed using either a dry plasma etch or a wet etch. In some embodiments, a wet etch with high selectivity may be used to remove the metal etch hard mask layer 214 relative to the dielectric layer 208. For example, when the dielectric layer 208 is $SiO_2$ and the metal etch hard mask layer 214 is SiN, hot phosphoric acid can be used to remove the SiN with no appreciable loss of the underlying $SiO_2$ layer.

Figure 8:
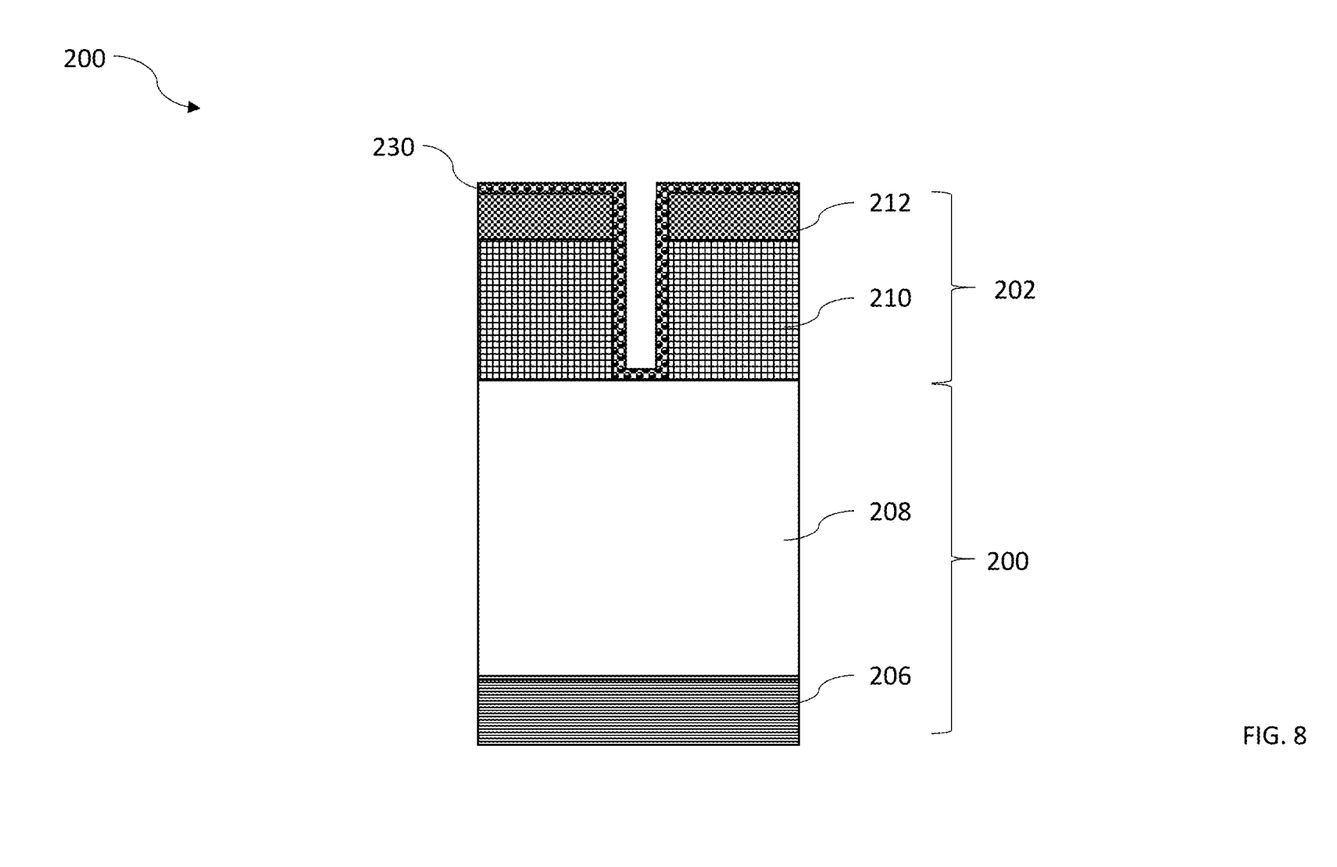

Referring next to operation 114 of FIG. 1 and the cross-sectional view in FIG. 8, a second metal shell layer 230 is deposited conformally on the horizontal and vertical surfaces of the metal shell hard mask layers 202. The second metal shell layer 230 may comprise a refractory metal such as tungsten, molybdenum, niobium, tantalum, titanium, chromium, hafnium, ruthenium, and zirconium. In one embodiment, the second metal shell layer 230 can be a material such as tungsten (W), tungsten nitride (WN), titanium tungsten (TiW), titanium (Ti), titanium nitride (TiN), tantalum (Ta), or tantalum nitride (TaN), molybdenum as well as carbides such as tungsten carbide. In various embodiments, the second metal shell layer 230 may be deposited using various thin film deposition techniques such as physical vapor deposition, chemical vapor deposition, atomic layer deposition, as well as other techniques such as sputtering, evaporation, and others. A thickness of the second metal shell layer 230 can be about 2 nm or thicker, for example 1 nm to 10 nm in one embodiment.

Figure 9:
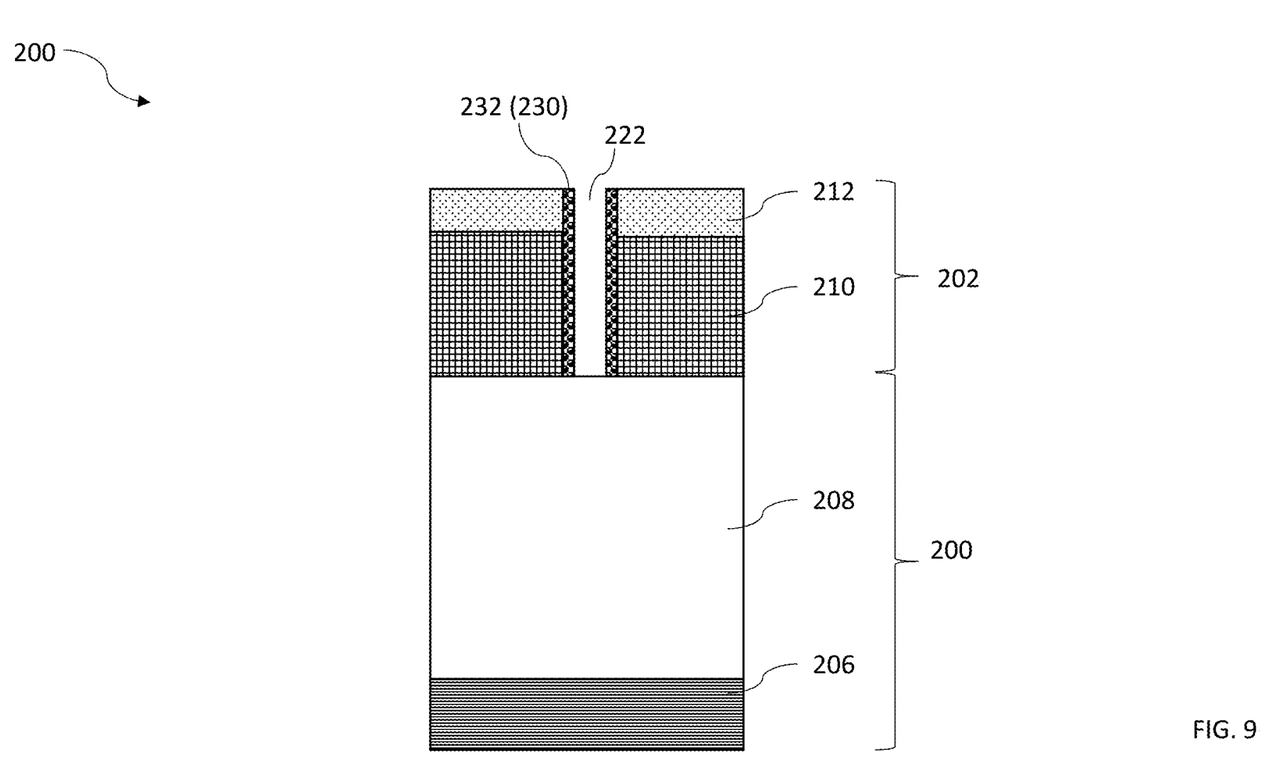

Referring next to operation 116 of FIG. 1 and the cross-sectional view in FIG. 9, an anisotropic etch removes the second metal shell layer 230 from the horizontal surfaces, forming a first portion of a metal spacer 232 in the opening 222. In particular, the second metal shell layer 230 is removed from the top surface of the substrate 200 to expose the dielectric layer 208 and from the top surface of the first metal shell layer 212 to expose its top surface, respectively. In an anisotropic etch, bias is applied to accelerate ions in the etching gas plasma toward the substrate. The vertical trajectory of the ions causes horizontal surfaces to etch much faster than vertical surfaces.

In various embodiments, the second metal shell layer 230 can be the same material as the first metal shell layer 212. Using the same metal shell material for the first metal shell layer 212 and second metal shell layer 230 may advantageously lower production cost by using the same metal deposition tool, which can reduce both cycle time and capital costs. In these embodiments, the anisotropic etch process must be carefully controlled to prevent complete removal of the first metal shell layer 212 from horizontal surfaces. In other embodiments, the first metal shell layer 212 material and the second metal shell layer 230 material can be different. These embodiments may increase equipment cost by requiring deposition of two different metals, but process control is relaxed. The anisotropic etch process window is significantly increased since the first metal shell layer 212 can be chosen to have high selectivity so as to be not removed while etching the second metal shell layer 230. This can ensure no part of the dielectric layer 208 is covered with any remaining second metal shell layer 230.

Figure 10:
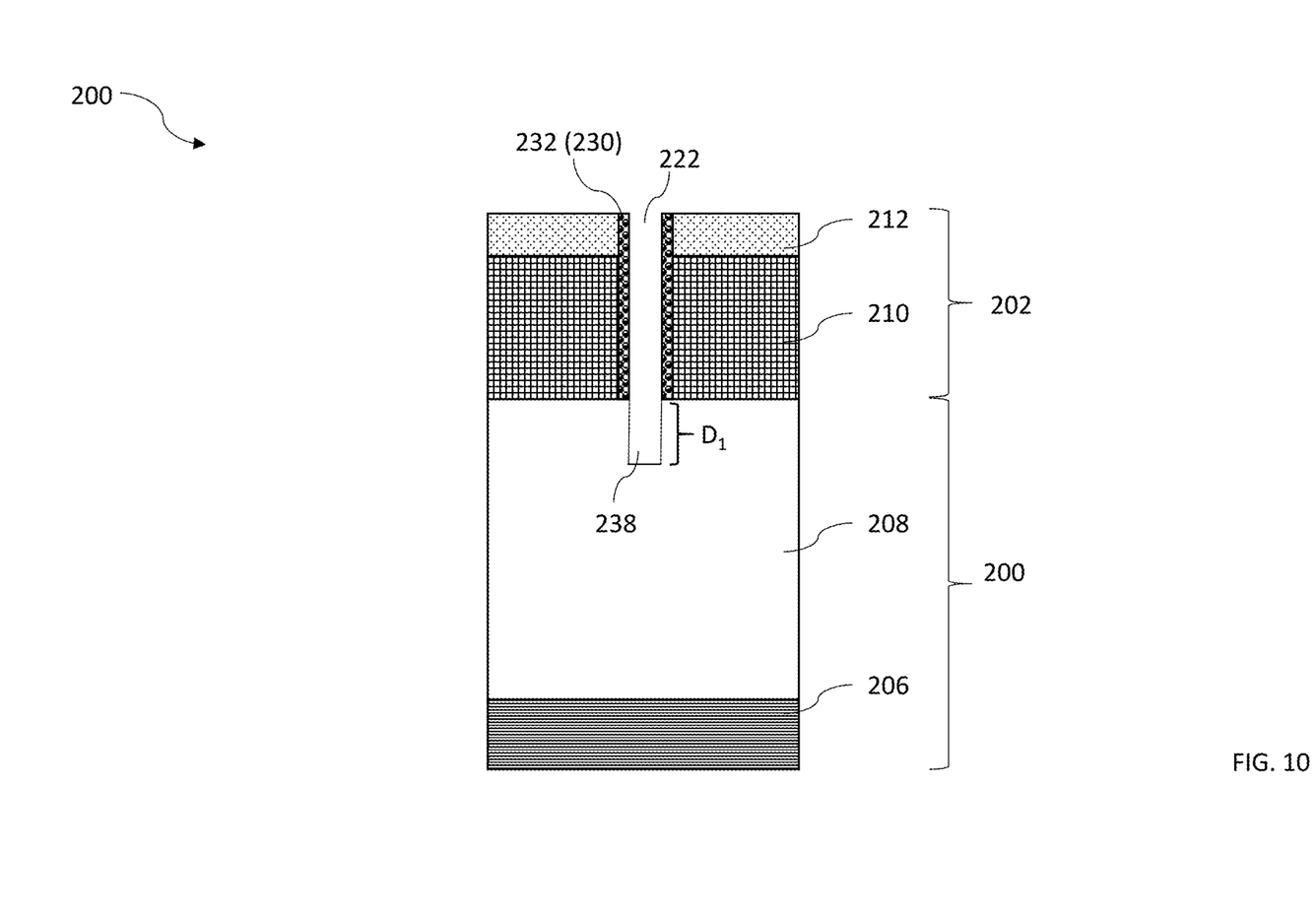

Referring next to operation 118 of FIG. 1 and the cross-sectional view in FIG. 10, upon forming the first portion of the metal spacer 232, a first recess 238 can be formed to partially extend into the dielectric layer 208 based on the metal shell hard mask layers 202, which includes the amorphous mask layer 210, the first metal shell layer 212, and the first portion of the metal spacer 232. For example, using the metal shell hard mask layers 202 as an etch mask, an anisotropic etch removes an upper portion of the dielectric layer 208 through the opening 222, thereby forming the first recess 238 below the opening 222. In an anisotropic etch, bias is applied to accelerate ions in the etching gas plasma toward the substrate. The vertical trajectory of the ions causes horizontal surfaces to etch much faster than vertical surfaces. As a non-limiting example, the first recess 238 may have a depth $D_1$ in a range from about 1 μm to about 2 μm.

Figure 11:
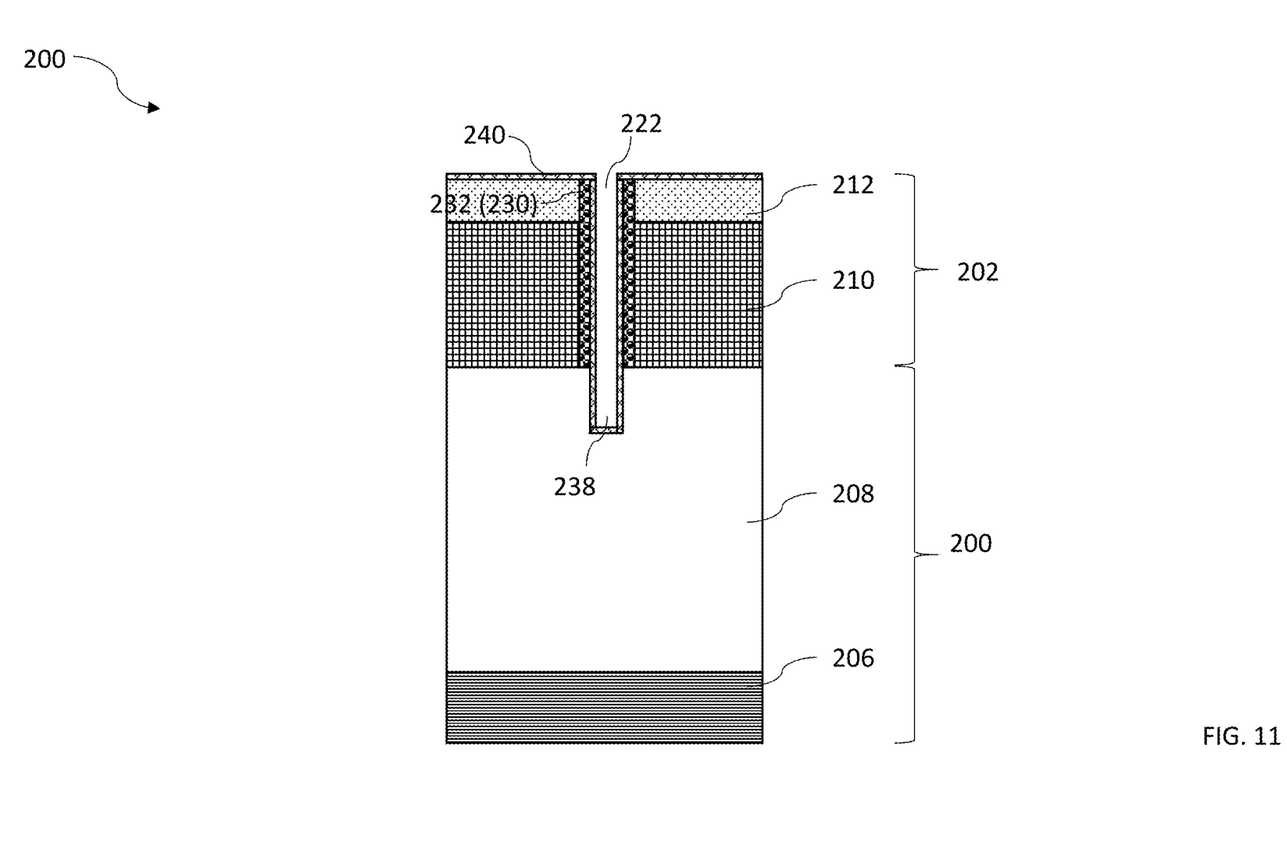

Referring next to operation 120 of FIG. 1 and the cross-sectional view in FIG. 11, a third metal shell layer 240 is deposited conformally over the workpiece, for example, on the horizontal and vertical surfaces of the metal shell hard mask layers 202 and further on sidewalls and bottom surface of the first recess 238. The third metal shell layer 240 and the second metal shell layer 230 may have the same metal material. The third metal shell layer 240 may comprise a refractory metal such as tungsten, molybdenum, niobium, tantalum, titanium, chromium, hafnium, ruthenium, and zirconium. In one embodiment, the third metal shell layer 240 can be a material such as tungsten (W), tungsten nitride (WN), titanium tungsten (TiW), titanium (Ti), titanium nitride (TiN), tantalum (Ta), or tantalum nitride (TaN), molybdenum as well as carbides such as tungsten carbide. In various embodiments, the third metal shell layer 240 may be deposited using various thin film deposition techniques such as physical vapor deposition, chemical vapor deposition, atomic layer deposition, as well as other techniques such as sputtering, evaporation, and others. A thickness of the third metal shell layer 240 can be about 2 nm or thicker, for example 1 nm to 10 nm in one embodiment.

Figure 12:
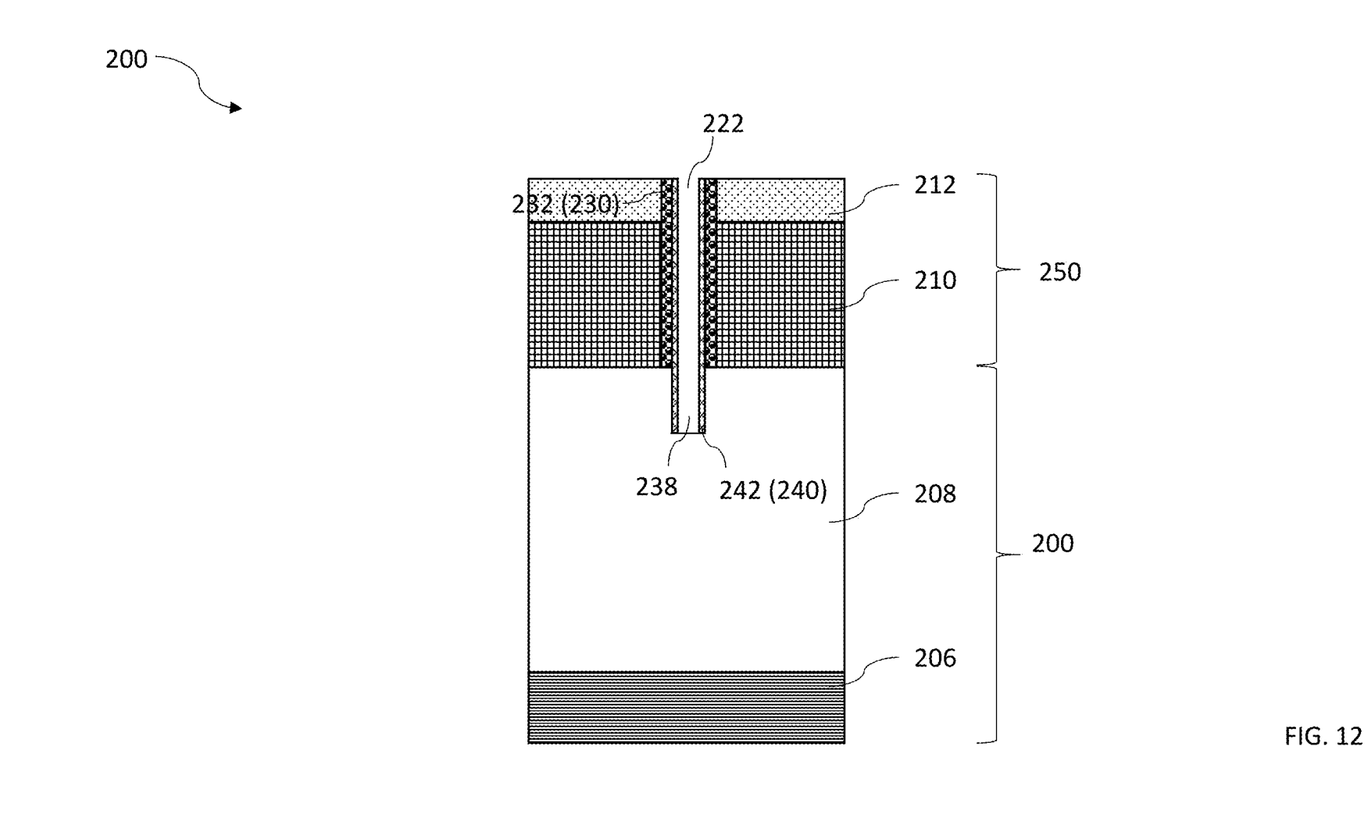

Referring next to operation 122 of FIG. 1 and the cross-sectional view in FIG. 12, an anisotropic etch removes the third metal shell layer 240 from the horizontal surfaces, forming a second portion of the metal spacer 242 in the opening 222 and the first recess 238. In particular, the third metal shell layer 240 is removed from the horizontal surface of the first recess 238 to again expose the dielectric layer 208, as illustrated in FIG. 12. Alternatively stated, the second portion of the metal spacer 242 can be formed to extend at least along the sidewalls of the first recess 238. In an anisotropic etch, bias is applied to accelerate ions in the etching gas plasma toward the substrate. The vertical trajectory of the ions causes horizontal surfaces to etch much faster than vertical surfaces.

In some embodiments, upon forming the second portion of the metal spacer 242, fabrication of a metal shell hard mask 250 is completed. Such metal shell hard mask 250 includes the amorphous mask layer 210, the first metal shell layer 212, the first portion of the metal spacer 232, and the second portion of the metal spacer 242. As shown, the first portion of the metal spacer 232 may extend along the sidewalls of both the amorphous mask layer 210 and the first metal shell layer 212, and the second portion of the metal spacer 242 may extend along (inner) sidewalls of the first portion of the metal spacer 232 and further extend along the sidewalls of the first recess 238. The amorphous mask layer 210 enables formation of thick hard masks with low stress. The thin first metal shell layer 212 and the metal spacer 232 and 242 provide high selectivity with little additional stress. The steps described for forming the metal shell hard mask 250 are for illustrative purposes and are not limiting. Those skilled in the art can use different but similar processes to fabricate embodiment metal shell hard masks 250.

Figure 13:
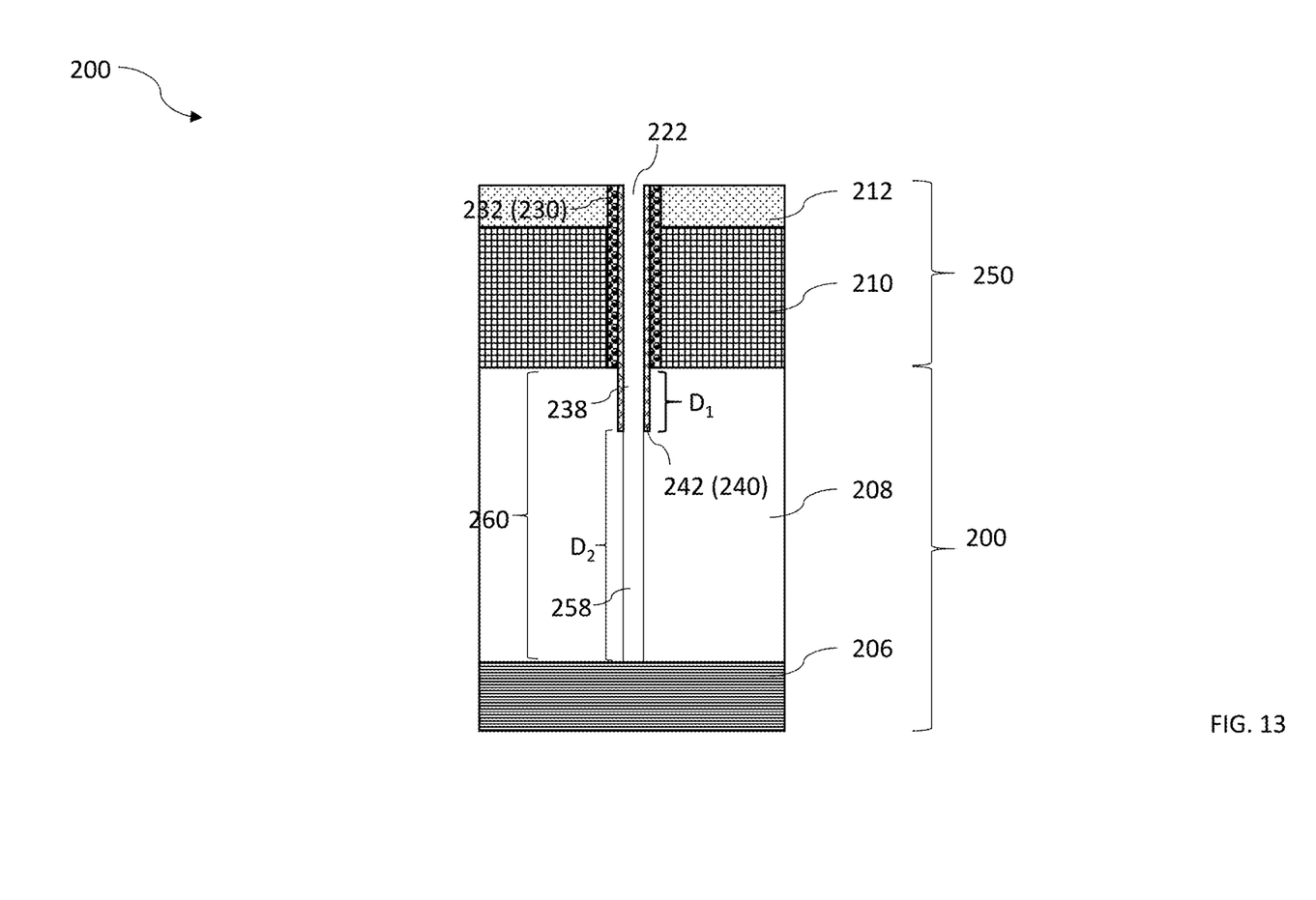

Referring next to operation 124 of FIG. 1 and the cross-sectional view in FIG. 13, the metal shell hard mask 250 is used as an etch mask to etch a high aspect ratio second recess 258 that extends through the dielectric layer 208 and stops on the semiconductor substrate 206. Such a high aspect ratio recess can be rectangular, square, circular (as in contacts) or any other regular or irregular shape and may be formed like a trench or hole in various embodiments. As a non-limiting example, the second recess 258 may have a depth $D_2$ substantially greater than the depth ($D_1$) of the first recess 238, for example, in a range from about 5 μm to about 100 μm. As such, the second recess 258 may have an aspect ratio (depth to width) substantially greater than the first recess 238 does, given that the first and second recesses may share a substantially similar width.

In some embodiments, operations 120 to 124 may be repeatedly performed until a desired depth and/or profile has been reached. For example, after forming the second recess 258, a fourth metal shell layer may be formed (operation 120), followed by etching horizontal portions of the fourth metal shell layer (operation 122). Next, a third recess may be formed to further extend the second recess 258 (operation 124).

In various embodiments, operations 102, 108, 114, 116, 118, 120, 122, and 124 may be performed in first, second, third, fourth, fifth, sixth, seventh, and eighth chambers, respectively. Each of the first to eighth chambers may house a workpiece (e.g., the semiconductor device 200 formed at any of the above fabrication stages) in a certain environment (e.g., a certain pressure, a certain temperature, a certain gas flow, etc.), which allows a certain process to be performed on the semiconductor device 200. For example, the first, third, and sixth chambers may each be configured to perform a deposition process (e.g., atomic layer deposition, chemical vapor deposition, physical vapor deposition, metal-organic chemical vapor deposition, molecular beam epitaxy, electron beam physical vapor deposition, etc.), and the second, fourth, fifth, seventh, and eighth chambers may each be configured to perform an etch process (e.g., plasma etch, wet etch, anisotropic wet etch, etc.). Further, in some embodiments, the first, third, and sixth chambers may be the same chamber, and the second, fourth, fifth, seventh, and eighth chambers may be the same chamber.

Advantageously, because the etch process removes less of the metal shell hard mask 250, specifically, the first metal shell layer 212, the thickness of the amorphous mask layer no does not need to be increased to compensate for mask erosion during etch. In addition, the metal spacers 232 and 242 on the sidewalls of the mask prevents lateral erosion during long etching times which can result in bowing of the sidewalls in the high aspect ratio openings being etched.

With metal shell hard masks (e.g., 250), the depth of the high aspect ratio features being etched is not limited by the mask. For example, high aspect ratio features (e.g., 258) may be etched deeper and with greater fidelity with a metal shell hard mask than with an amorphous material hard mask. In one or more embodiments, a depth ($D_1$ and $D_2$) etched in the dielectric layer 208, i.e., a depth of the high aspect ratio feature, may be 2 to 100 times a collective thickness of the amorphous mask layer 210 and the first metal shell layer 212.

Following the formation of such a high aspect ratio feature (e.g., 238 and 258, which are hereinafter "feature 260") in the dielectric layer 208, a semiconductor material or a metal material may be deposited to partially or fully fill the feature 260 (together with the opening 222), in various embodiments. In one example, the semiconductor material may be selected from the group consisting of: silicon, silicon germanium, a conductive oxide material, a two-dimensional (2D) semiconductor material, and combinations thereof, which can form respective channels of a number of memory cells of a three-dimensional (3D) memory array that are vertically spaced from one another. In another example, the metal material may be selected from the group consisting of: copper, aluminum, tungsten, gold, and combinations thereof, which can form a control line (e.g., a word line, a source line, a bit line) shared by a number of memory cells of a three-dimensional (3D) memory array that are vertically spaced from one another.

Subsequently to filling the feature 260 with a suitable material, a substantial portion of the metal shell hard mask 250 may be removed through a polishing process (e.g., a chemical mechanical polishing (CMP) process) and/or one or more (e.g., dry and/or wet) etch processes. For example, the polishing process may remove the amorphous mask layer 210 and the first metal shell layer 212 (together with respective portions of other components above the top surface of the dielectric layer 208). As such, a lower part of the second portion of metal spacer 242 (disposed below the top surface of the dielectric layer 208) may remain. In another example, the polishing process may remove the amorphous mask layer 210 and the first metal shell layer 212 (together with the first and second portions of the metal spacer 232 and 242) until the lower part of the second portion of metal spacer 242 extending into the dielectric layer 208 is also removed. In yet another example, the first metal shell layer 212 may be removed by a wet etch process, and the amorphous mask layer 210 may be removed by a dry etch process using oxygen plasma.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

What is claimed is:

1. A method for forming a semiconductor device, comprising:
    forming a first metal layer on top of an amorphous mask layer disposed over a substrate;
    patterning the first metal layer and the amorphous mask layer using a metal etch hard mask layer to form an opening in the amorphous mask layer;
    forming a second metal layer that extends along vertical sidewalls of the opening;
    forming a first recess partially extending into the substrate using the first metal layer and the second metal layer as a first etch mask;
    forming a third metal layer that extends along vertical sidewalls of the first recess; and
    forming a second recess below the first recess using the first to third metal layers as a second etch mask.

2. The method of claim 1, wherein the first to third metal layers each comprise a refractory metal.

3. The method of claim 1, wherein the second and third metal layers each comprise a metal material selected from the group consisting of: tungsten, titanium, tantalum, molybdenum, chromium, hafnium, ruthenium, and combinations thereof.

4. The method of claim 3, wherein the second and third metal layers each comprise titanium and tungsten.

5. The method of claim 1, wherein the first to third metal layers each comprise tungsten or tungsten nitride.

6. The method of claim 1, wherein the first to third metal layers are comprised of the same metal material.

7. The method of claim 1, wherein the amorphous mask layer comprises amorphous carbon, spin-on carbon, or amorphous silicon.

8. The method of claim 1, further comprising:
    forming a fourth metal layer that extends at least along vertical sidewalls of the second recess; and
    forming a third recess below the second recess using the first to fourth metal layers as a third etch mask.

9. The method of claim 1, wherein the substrate is comprised of a single dielectric layer having silicon oxide.

10. The method of claim 1, wherein the substrate is comprised of a plurality of alternately stacked first dielectric layers and second dielectric layers, the first dielectric layers each having silicon dioxide and the second dielectric layers each having silicon nitride or silicon oxynitride.

11. The method of claim 1, further comprising filling the first and second recesses with a semiconductor material or a metal material.

12. A method for forming a semiconductor device, comprising:
   forming a mask layer over a substrate;
   forming a first metal layer comprising a first metal over the mask layer;
   forming an opening in the first metal layer and the mask layer using a patterned metal etch hard mask layer;
   forming a first portion of a metal spacer comprising a second metal along sidewalls of the opening;
   etching the substrate to form a first recess using the first metal layer and the first portion of the metal spacer as a first etch mask;
   forming a second portion of the metal spacer comprising a third metal along sidewalls of the first recess; and
   etching the substrate to form a second recess below the first recess using the first metal layer and both of the first and second portions of the metal spacer as a second etch mask.

13. The method of claim 12, wherein the step of forming the first portion of the metal spacer further comprises:
   depositing a second metal layer; and
   etching horizontally extending portions of the second metal layer to form the first portion of the metal spacer.

14. The method of claim 12, wherein the step of forming the second portion of the metal spacer further comprises:
   depositing a third metal layer; and
   etching horizontally extending portions of the third metal layer to form the second portion of the metal spacer.

15. The method of claim 12, wherein the first to third metals each comprise a refractory metal.

16. The method of claim 12, further comprising filling the first and second recesses with a semiconductor material or a metal material.

17. The method of claim 16, further comprising forming a feature of a three-dimensional (3D) memory cell based on the semiconductor material or the metal material filling the first and second recesses.

18. The method of claim 12, wherein the first recess has a first aspect ratio of its depth to its width, and the second recess has a second aspect ratio of its depth to its width, and wherein the second aspect ratio is substantially greater than the first aspect ratio.

19. An apparatus, comprising:
   a first chamber configured to house a substrate overlaid by a mask layer and perform deposition of a first metal layer over the mask layer;
   a second chamber configured to form an opening through the first metal layer and the mask layer using a patterned metal etch hard mask layer;
   a third chamber configured to perform deposition of a second metal layer to extend along vertical sidewalls of the opening;
   a fourth chamber configured to etch a horizontal portion of the second metal layer;
   a fifth chamber configured to form, based at least on a remaining vertical portion of the second metal layer, a first recess extending into the substrate;
   a sixth chamber configured to perform deposition of a third metal layer to extend along vertical sidewalls of the first recess;
   a seventh chamber configured to etch a horizontal portion of the third metal layer; and
   an eighth chamber configured to form, based at least on a remaining vertical portion of the third metal layer, a second recess further extending into the substrate.

20. The apparatus of claim 19, wherein the first chamber, the third chamber, and the sixth chamber are a same chamber.

* * * * *